US009658271B2

(12) United States Patent
Thomas et al.

(10) Patent No.: US 9,658,271 B2
(45) Date of Patent: May 23, 2017

(54) WIRE FAULT ILLUMINATION AND DISPLAY

(75) Inventors: Terrance L. Thomas, Covington, WA (US); John Henry Boose, Bellevue, WA (US)

(73) Assignee: THE BOEING COMPANY, Chicago, IL (US)

(*) Notice: Subject to any disclaimer, the term of this patent is extended or adjusted under 35 U.S.C. 154(b) by 1650 days.

(21) Appl. No.: 12/208,638

(22) Filed: Sep. 11, 2008

(65) Prior Publication Data

US 2010/0063754 A1 Mar. 11, 2010

(51) Int. Cl.
*G01R 31/28* (2006.01)
*G01R 31/08* (2006.01)

(52) U.S. Cl.
CPC .......... *G01R 31/086* (2013.01); *G01R 31/088* (2013.01)

(58) Field of Classification Search
CPC ............................ G01R 31/086; G01R 31/088
USPC .......................................................... 702/59
See application file for complete search history.

(56) References Cited

U.S. PATENT DOCUMENTS

| | | | |
|---|---|---|---|
| 4,970,664 A * | 11/1990 | Kaiser et al. ................. 715/804 |
| 5,977,773 A | 11/1999 | Medelius et al. |
| 6,272,387 B1 * | 8/2001 | Yoon .............................. 700/83 |
| 6,606,731 B1 | 8/2003 | Baum et al. |
| 6,766,331 B2 * | 7/2004 | Shema et al. |
| 6,922,432 B2 * | 7/2005 | Callaway et al. ............ 375/141 |
| 7,069,163 B2 | 6/2006 | Gunther et al. |
| 7,139,668 B2 | 11/2006 | Bechhoefer |
| 7,200,271 B2 | 4/2007 | Boose et al. |
| 7,212,936 B2 | 5/2007 | Baum et al |
| 7,250,772 B2 | 7/2007 | Furse et al. |
| 7,282,922 B2 | 10/2007 | Lo et al. |
| 7,295,119 B2 | 11/2007 | Rappaport et al. |
| 7,353,130 B2 | 4/2008 | Booth, Jr. et al. |
| 7,368,919 B2 | 5/2008 | Gervais |
| 7,478,352 B2 | 1/2009 | Chaplin et al. |
| 7,529,648 B2 | 5/2009 | Baum et al. |
| 7,548,071 B2 * | 6/2009 | Harrison et al. .............. 324/617 |
| 7,558,212 B2 | 7/2009 | Olinski |
| 7,636,622 B2 * | 12/2009 | Underdal et al. ............... 701/29 |
| 7,868,621 B2 | 1/2011 | Liu et al. |
| 2002/0147561 A1 * | 10/2002 | Baracat et al. ............... 702/119 |
| 2004/0039976 A1 * | 2/2004 | Gunther et al. .............. 714/742 |
| 2004/0230387 A1 * | 11/2004 | Bechhoefer ..................... 702/58 |
| 2004/0236547 A1 * | 11/2004 | Rappaport et al. ............... 703/2 |

(Continued)

FOREIGN PATENT DOCUMENTS

FR 2822130 A1 * 9/2002

OTHER PUBLICATIONS

Machine translation of FR 2822130.*

(Continued)

*Primary Examiner* — Patrick Assouad
*Assistant Examiner* — Haidong Zhang
(74) *Attorney, Agent, or Firm* — Yee & Associates, P.C.

(57) ABSTRACT

A computer implemented method, apparatus, and computer usable program product for illuminating faults in a wiring system. The wiring system is monitored for a fault during operation of the wiring system. In response to detecting the fault, a location of the fault within the wiring system is estimated. A wiring diagram is presented for the wiring system with an indication of the location of the fault within the wiring system.

27 Claims, 10 Drawing Sheets

(56) References Cited

U.S. PATENT DOCUMENTS

| | | | |
|---|---|---|---|
| 2005/0114096 | A1 | 5/2005 | Baum et al. |
| 2006/0012376 | A1 | 1/2006 | Furse et al. |
| 2006/0043976 | A1* | 3/2006 | Gervais .......................... 324/508 |
| 2006/0182269 | A1 | 8/2006 | Lo et al. |
| 2007/0236504 | A1 | 10/2007 | Baum et al. |
| 2007/0300198 | A1* | 12/2007 | Chaplin et al. ................. 716/10 |
| 2009/0228223 | A1* | 9/2009 | Liu et al. ......................... 702/59 |

OTHER PUBLICATIONS

English Abstract of FR 2822130.*
Pellon et al., "Aircraft Electrical System Monitoring with Arc Fault Circuit Protection and Automatic Fault Location", Sensata Technologies, 06-PSC18, 2006, pp. 1-6.
Smith et al., "Analysis of Spread Spectrum Time Domain Reflectometry for Wire Fault Location", IEEE Sensors Journal, vol. 5, No. 6, Dec. 2005, pp. 1469-1478.
Furse et al., "Spread Spectrum Sensors for Critical Fault Location on Live Wire Networks", Structural Control and Health Monitoring, www.interscience.wiley.com, Jun. 6, 2005, pp. 257-267.
Slenski et al., "Novel Technologies for Improving Wire System Integrity", Air Force Research Laboratory, Materials and Manufacturing Directorate, USA, 2006, pp. 1-19.
USPTO Office Action dated Mar. 29, 2012 for U.S. Appl. No. 12/645,805, 23 pages.
Bogatin, "Simulating a TDR", Printed Circuit Design & Manufacture, Jun. 2005, p. 48.
Lo et al., "Modeling and Simulation of Branched Wiring Networks", ACES Journal, vol. 23, No. 2, Jun. 2008, pp. 143-148.
Thomas et al., "Boeing Commercial Airplanes Wire Assessment Activities", Aging Aircraft Conference, May 2009, 18 pages.

* cited by examiner

WIRE FAULT ILLUMINATION AND DISPLAY

BACKGROUND INFORMATION

1. Field

The present disclosure relates generally to an improved data processing system and in particular to a method and apparatus for illuminating faults in a wiring system. Still more particularly, the present disclosure relates to a computer implemented method, apparatus, and computer usable program code for displaying wiring faults in a wiring system.

2. Background

Complex systems, such as modern aircraft, may have tens of miles of wiring. Wires are used to distribute power and/or data to various types of devices in an aircraft. Diagrams illustrating representations of these systems are referred to as schematic diagrams. A schematic diagram may identify the connections and interactions between various devices. The connections between devices, providing flow for power and/or data, are referred to as paths. A path may include any component that connects to a device. These systems of connections and devices may be referred to as wiring systems.

In the aircraft industry, schematic diagrams are used to illustrate devices and the paths connecting various devices in an aircraft. A path may take various forms. For example, a path may be, for example, a wire, a cable, a data cable, an optical cable, or some other suitable component. In electrical wiring diagrams, devices may include, for example, modules, line replaceable units, computers, plugs, switches, buses, power sources, grounds, wires, connectors, and other suitable items included in the path.

A schematic diagram of a wiring system is typically embodied as a set of multiple hard copy drawings. Each of these drawings may present a portion of the overall schematic diagram. Thus, each drawing in a set may include references to other drawings to identify where the portion of the schematic diagram is continued on another drawing.

The use of these types of schematic diagrams may be time-consuming and difficult for a user, such as one from maintenance personnel, when referencing or identifying more than one path. A user manually locates one of the devices in the off drawing references and traces the path to another device through one or more drawings. In addition, many times a device may be illustrated on multiple drawings, such as when the device is included in more than one path. With this situation, a user locates a drawing that includes the desired path associated with the device before identifying each device itself.

SUMMARY

The advantageous embodiments provide a computer implemented method, apparatus, and computer usable program product for illuminating faults in a wiring system. The wiring system is monitored for a fault during operation of the wiring system. In response to detecting the fault, a location of the fault within the wiring system is estimated. A wiring diagram is presented for the wiring system with an indication of the location of the fault within the wiring system.

In another advantageous embodiment, a data processing system comprises a bus, a communications unit connected to the bus, a storage device, and a processor unit. The storage device includes computer usable program code. The processor unit executes the computer usable program code to monitor a wiring system for a fault during operation of the wiring system; estimate a location of the fault within the wiring system in response to detecting the fault; and present a wiring diagram for the wiring system with an indication of the location of the fault within the wiring system.

In yet another advantageous embodiment, a computer program product contains program code on a computer recordable storage medium. Program code is present for monitoring a wiring system for a fault during operation of the wiring system. Program code is also present for estimating a location of the fault within the wiring system in response to detecting the fault. Program code is present for presenting a wiring diagram for the wiring system with an indication of the location of the fault within the wiring system.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
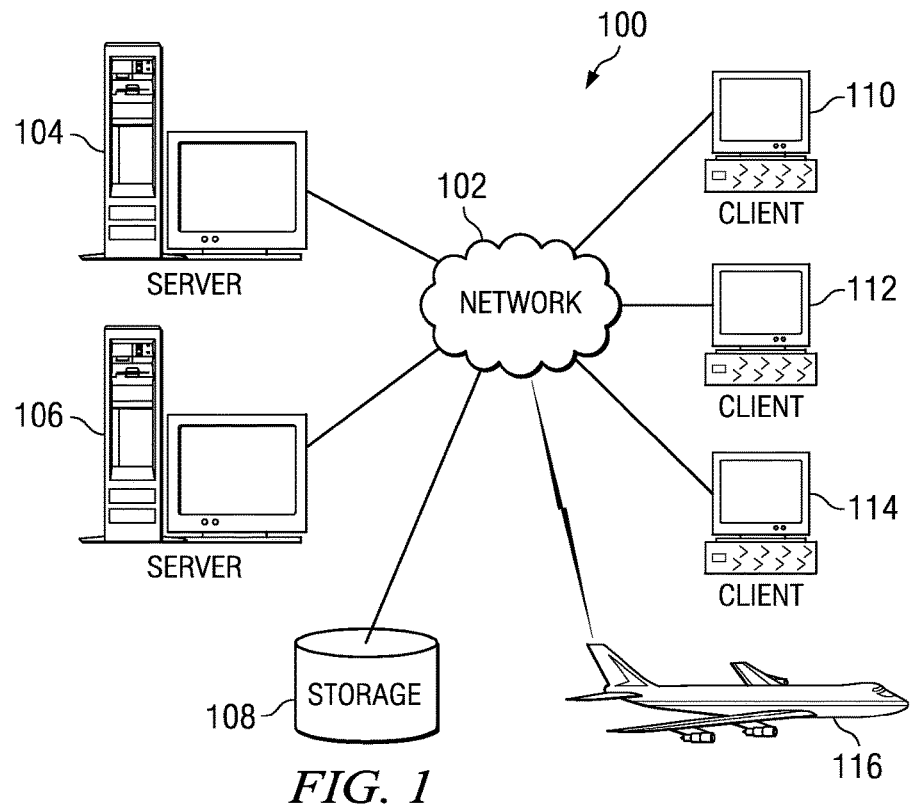
FIG. 1 is an exemplary diagram of data processing environment in which an advantageous embodiment may be implemented.

With reference now to the figures and in particular with reference to FIG. 1, an exemplary diagram of a data processing environment is provided in which the advantageous embodiments may be implemented. It should be appreciated that FIG. 1 is only exemplary and not intended to assert or imply any limitation with regard to the environment in which different embodiments may be implemented. Many modifications to the depicted environments may be made.

FIG. 1 depicts a pictorial representation of a network of data processing systems in which the advantageous embodiments may be implemented. Network data processing system 100 is a network of computers in which embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. These clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example.

Aircraft 116 also is a client that may exchange information with clients 110, 112, and 114. Aircraft 116 also may exchange information with servers 104 and 106. Aircraft 116 may exchange data with different computers through a wireless communications link while in-flight or any other type of communications link while on the ground. Aircraft 116 may include a wiring system in which advantageous embodiments may be implemented to monitor the wiring system for faults while the wiring system is in operation.

In these examples, server 104, server 106, client 110, client 112, and client 114 may be computers. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. Of course, network data processing system 100 also may be implemented as a number of different types of networks, such as for example, an intranet, a local area network (LAN), or a wide area network (WAN). FIG. 1 is intended as an example, and not as an architectural limitation for different embodiments.

Figure 2:
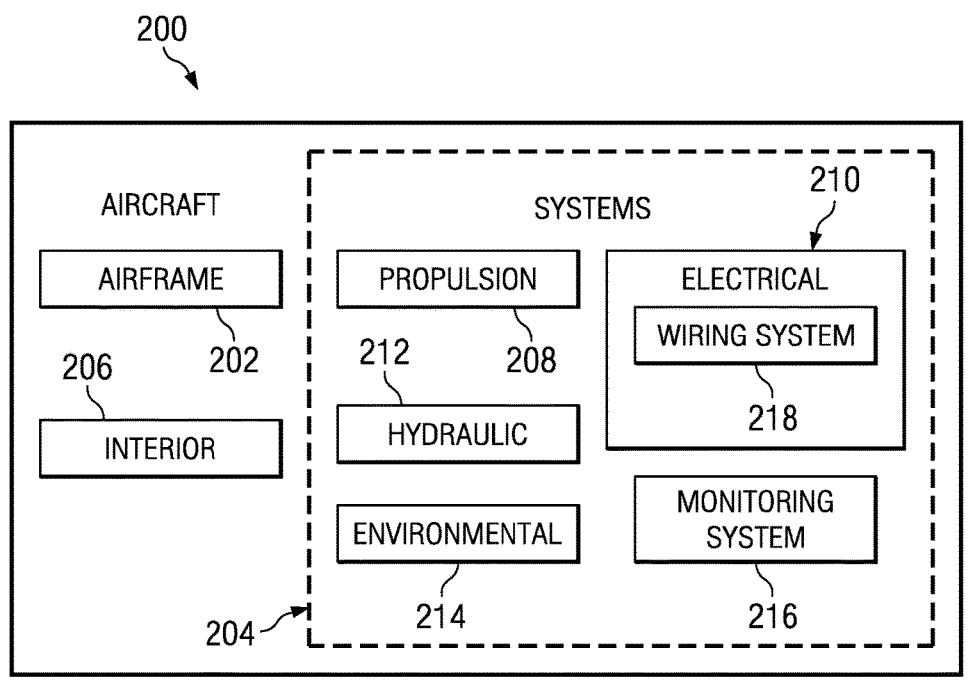
FIG. 2 is a diagram of an aircraft in accordance with an advantageous embodiment.

With reference now to FIG. 2, a diagram of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, environmental system 214, and monitoring system 216.

In this example, monitoring system 216 may monitor wiring system 218 within electrical system 210 to identify and display faults. Monitoring system 216 may detect faults during operation of wiring system 218 in aircraft 200. Further, monitoring system 216 may present a display of any fault detected within wiring system 218. This display of the fault may include a display of a schematic diagram with fault information. The fault information may indicate a location of the fault within wiring system 218.

More specifically, monitoring system 216 may display a location of a fault along a path within wiring system 218. Further, monitoring system 216 also may display an installation diagram identifying a location in aircraft 200 at which the fault may be present. Any number of other systems may be integrated with the wiring fault, including system events that occur as a result of the wiring fault. Although an aerospace example is shown, different advantageous embodiments may be applied to other industries, such as the automotive industry.

Figure 3:
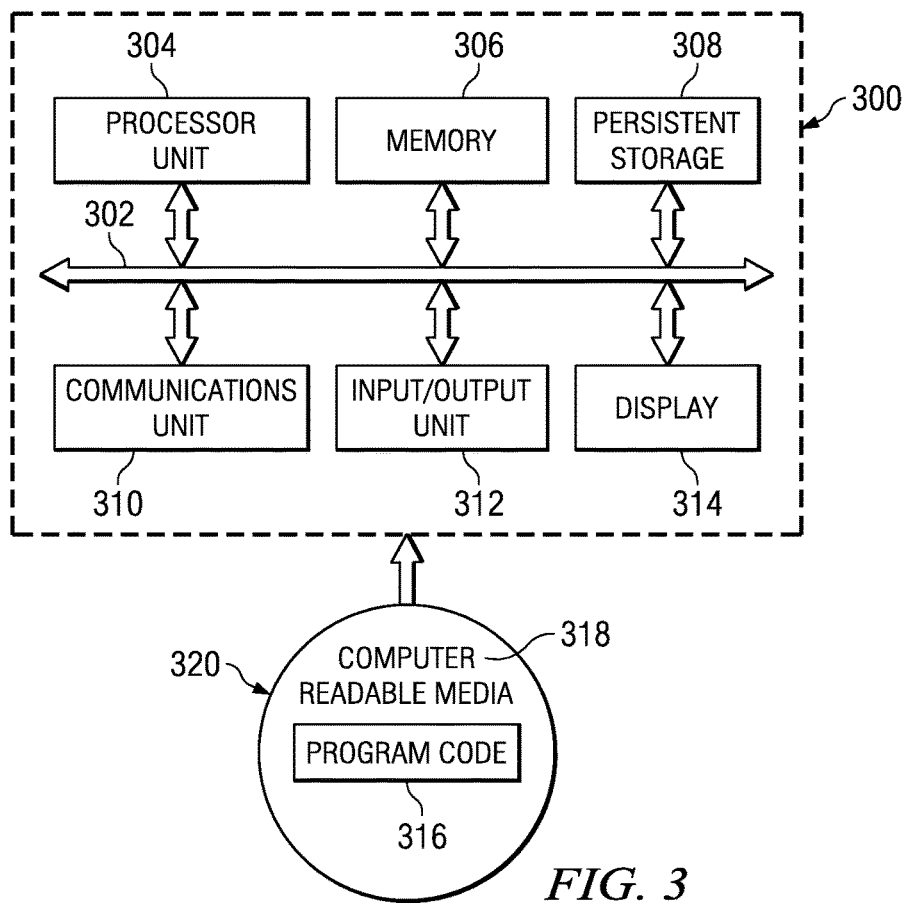
FIG. 3 is a diagram of a data processing system in accordance with an advantageous embodiment.

Turning now to FIG. 3, a diagram of a data processing system is depicted in accordance with an advantageous embodiment. Data processing system 300 is an example of a data processing system that may be used to implement servers and clients, such as server 104 and client 110 in FIG. 1. Further, data processing system 300 is an example of a data processing system that may be found in aircraft 116 in FIG. 1. Data processing system 300 also may be used to implement monitoring system 216 in FIG. 2, in these examples.

In this illustrative example, data processing system 300 includes communications fabric 302, which provides communications between processor unit 304, memory 306, persistent storage 308, communications unit 310, input/output (I/O) unit 312, and display 314.

Processor unit 304 serves to execute instructions for software that may be loaded into memory 306. Processor unit 304 may be a set of one or more processors or may be a multi-processor core, depending on the particular implementation. Further, processor unit 304 may be implemented using one or more heterogeneous processor systems in which a main processor is present with secondary processors on a single chip. As another illustrative example, processor unit 304 may be a symmetric multi-processor system containing multiple processors of the same type.

Memory 306, in these examples, may be, for example, a random access memory or any other suitable volatile or non-volatile storage device. Persistent storage 308 may take various forms depending on the particular implementation. For example, persistent storage 308 may contain one or more components or devices. For example, persistent storage 308 may be a hard drive, a flash memory, a rewritable optical disk, a rewritable magnetic tape, or some combination of the above. The media used by persistent storage 308 also may be removable. For example, a removable hard drive may be used for persistent storage 308.

Communications unit 310, in these examples, provides for communications with other data processing systems or devices. In these examples, communications unit 310 is a network interface card. Communications unit 310 may provide communications through the use of either or both physical and wireless communications links.

Input/output unit 312 allows for input and output of data with other devices that may be connected to data processing system 300. For example, input/output unit 312 may provide a connection for user input through a keyboard and mouse. Further, input/output unit 312 may send output to a printer. Display 314 provides a mechanism to display information to a user.

Instructions for the operating system and applications or programs are located on persistent storage 308. These instructions may be loaded into memory 306 for execution by processor unit 304. The processes of the different embodiments may be performed by processor unit 304 using computer implemented instructions, which may be located in a memory, such as memory 306. These instructions are referred to as, program code, computer usable program code, or computer readable program code that may be read and executed by a processor in processor unit 304. The program code in the different embodiments may be embodied on different physical or tangible computer readable media, such as memory 306 or persistent storage 308.

Program code 316 is located in a functional form on computer readable media 318 and may be loaded onto or transferred to data processing system 300 for execution by processor unit 304. Program code 316 and computer readable media 318 form computer program product 320 in these examples. In one example, computer readable media 318 may be in a tangible form, such as, for example, an optical or magnetic disc that is inserted or placed into a drive or other device that is part of persistent storage 308 for transfer onto a storage device, such as a hard drive that is part of persistent storage 308.

In a tangible form, computer readable media 318 also may take the form of a persistent storage, such as a hard drive or a flash memory that is connected to data processing system 300. The tangible form of computer readable media 318 is also referred to as computer recordable storage media.

Alternatively, program code 316 may be transferred to data processing system 300 from computer readable media 318 through a communications link to communications unit 310 and/or through a connection to input/output unit 312. The communications link and/or the connection may be physical or wireless in the illustrative examples. The computer readable media also may take the form of non-tangible media, such as communications links or wireless transmissions containing the program code.

The different components illustrated for data processing system 300 are not meant to provide architectural limitations to the manner in which different embodiments may be implemented. The different illustrative embodiments may be implemented in a data processing system including components in addition to or in place of those illustrated for data processing system 300. Other components shown in FIG. 3 can be varied from the illustrative examples shown.

For example, a bus system may be used to implement communications fabric 302 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 306 or a cache such as found in an interface and memory controller hub that may be present in communications fabric 302.

The different advantageous embodiments recognize that effective methods are not currently present to monitor and/or identify faults in a wiring system during operation of the wiring system. In other words, currently available methods do not monitor a wiring system when the wiring system is operating or energized. During operation, power, digital signals, and/or analog data signals may be present. Further, the different advantageous embodiments also recognize that if faults can be identified during an operation of the wiring system, intermittent faults may be identified more easily. These maintenance operations may include verifying and repairing any faults.

The advantageous embodiments recognize that methods are present for identifying wiring faults on non-operational wiring systems. The ability to identify faults in a wiring system during operation of the wiring system in real time may allow for identification of both intermittent and hard faults. In the different advantageous embodiments, a hard fault is a fault that occurs but does not go away. An intermittent fault is a fault that may be present only for some period of time and may or may not reoccur. The faults that may be identified include open or short fault conditions that may occur during operation but may not be present when the wiring system is not operating.

The different advantageous embodiments recognize that this type of identification may be important because many hard faults start as intermittent faults. As a result, the different advantageous embodiments recognize that the capability to identify intermittent faults may allow for the performance of maintenance operations before these faults become hard faults which may cause a failure or a loss of functionality in components within the wiring system.

The different advantageous embodiments recognize that with intermittent faults, much time and expense may be incurred in troubleshooting and locating faults. The intermittent fault may eventually become a hard fault, at which time the fault may then be more easily identified. In the meantime, however, reduced functionality and risks of diversions may occur with respect to a vehicle.

The different advantageous embodiments also recognize that wiring information may be limited by an ability to associate with a system as presented by physical paper. The different advantageous embodiments recognize that it would be advantageous to have a capability to dynamically assemble the wiring information and integrate this information with a location within a vehicle to identify the location of the fault as well as possible locations to access the fault.

Thus, the different advantageous embodiments provide a computer implemented method, apparatus, and computer usable program code for identifying faults in a wiring system. A wiring system is monitored for a fault during operation of the wiring system. In response to detecting the fault, a location of the fault is estimated within the wiring system. A wiring diagram for the wiring system is presented with an indication of the location of the fault within the wiring system. Further, the different advantageous embodiments provide a capability to determine whether the fault is an intermittent fault or a hard fault.

This wiring diagram may include creating a diagram for the portion of the vehicle containing a path in which the fault is located in the wiring system. A schematic diagram of the path in which the fault was detected is associated with the diagram for presentation. Further, an indication of the fault in the location of the path that correlates to the location of the fault in the presentation is made.

The diagram of the portion of the vehicle may be combined with the schematic diagram to show the different devices and paths in their locations within the vehicle. This type of diagram is referred to as an installation diagram. In these examples, the path may be, for example, a wire, a cable, an optical cable, or some other medium through which electrical power and/or data signals may be sent.

Figure 4:
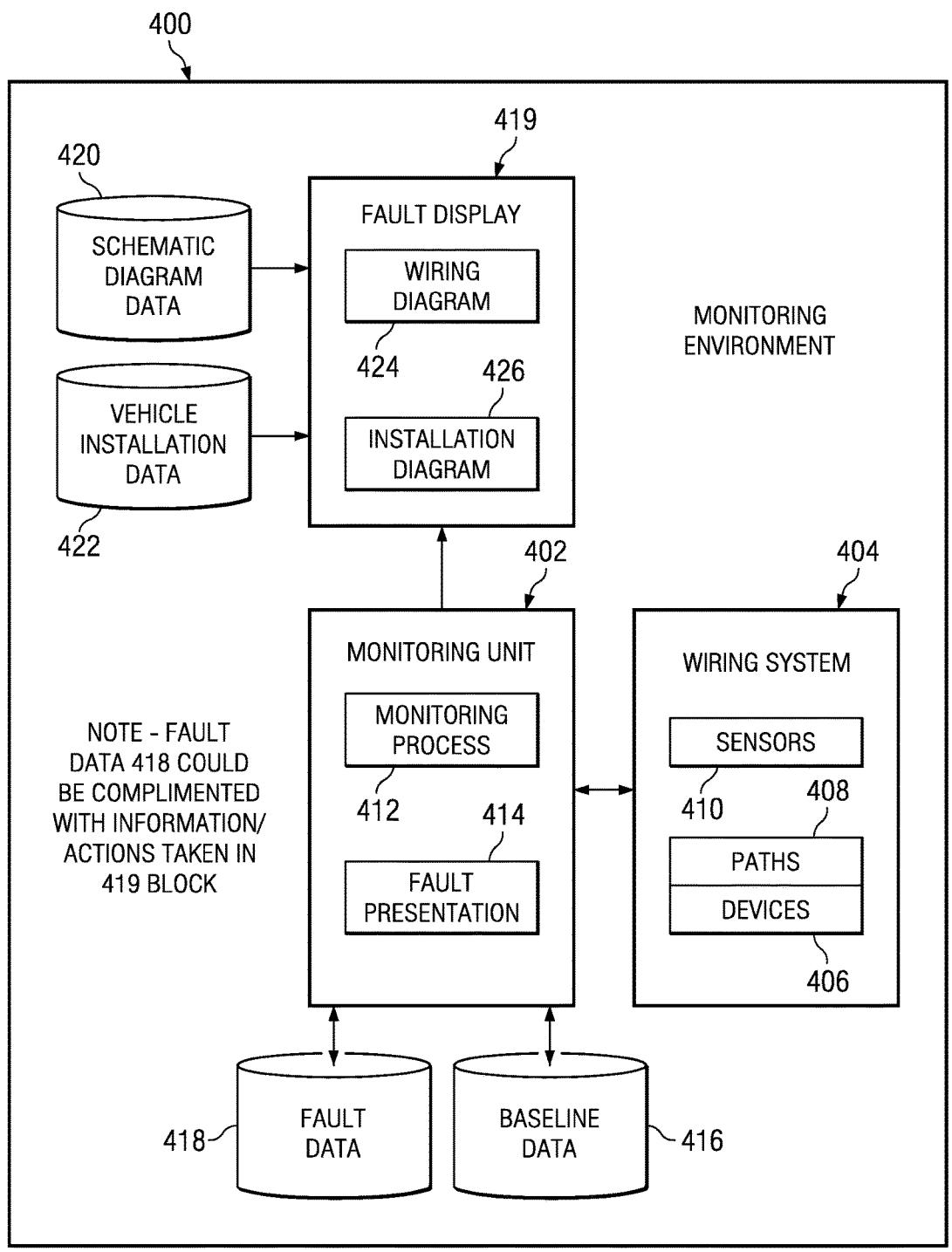
FIG. 4 is a block diagram of a monitoring environment in accordance with an advantageous embodiment.

With reference now to FIG. 4, a block diagram of a monitoring environment is depicted in accordance with an advantageous embodiment. In this example monitoring environment 400 is an example of a monitoring environment that may be found with a vehicle, such as, for example, aircraft 200 in FIG. 2. Of course, monitoring environment 400 may be found in other types of vehicles. These other types of vehicles may include, for example, without limitation, a submarine, a car, a tank, a train, a ship, a spacecraft, or some other suitable vehicle.

Further, the different advantageous embodiments may be applied to monitoring objects other than vehicles. For example, monitoring environment 400 also may be implemented in a building, a power plant, or some other object containing a wiring system.

In this example, monitoring unit 402 may monitor wiring system 404. Wiring system 404 may include, in these examples, devices 406 and paths 408. Devices 406 may include any number of devices and/or systems. For example, devices 406 may include a line replaceable unit, elements of a landing gear sub-system, a fuel pump, a valve, an actuator, a sensor, a computer, and/or or some other suitable component. Paths 408 contain the medium through which power and data may flow to devices 406. Paths 408 may include, for example, electrical wires, optical cables, network cables, or other types of paths capable of conducting or routing power and/or data.

Monitoring unit 402 and sensors 410 may be part of a monitoring system such as, for example, monitoring system 216 in FIG. 2. Monitoring unit 402 includes monitoring process 412 and fault presentation 414 to monitor wiring system 404. Monitoring unit 402 may be implemented using a data processing system, such as, for example, data processing system 300 in FIG. 3. In these examples, sensors 410 are connected to different locations within wiring system 404 to monitor for a presence or occurrence of a fault during operation of wiring system 404.

Sensors 410 may be located at termination points in paths 408 or within paths 408 depending on the particular implementation. Sensors 410 may transmit test signals and receive responses to the test signals.

In the different advantageous embodiments, a test signal in the form of a spread spectrum signal is sent into wiring system 404 using sensors 410. The response to this signal is detected by sensors 410. The response is sent to monitoring unit 402 for analysis. The analysis may be performed using monitoring process 412 in these examples.

In the different advantageous embodiments, monitoring unit 402 and sensors 410 may employ spread spectrum time domain reflectometry. An example of this type of system may be available from LiveWire Test Labs, Inc. In these examples, monitoring process 412 may cause sensors 410 to generate signals and may then analyze the responses. These responses may be referred to as echoes or reflections of these signals generated by sensors 410.

In the different advantageous embodiments, monitoring process 412 may cause sensors 410 to generate signals that are capable of identifying faults, such as, for example, an open circuit, a high impedance fault, a short circuit, a low impedance fault, and/or other suitable faults. The echoes or reflections of the signals generated by sensors 410 may be compared to baseline data 416. Baseline data 416 is obtained during proper operation of wiring system 404 when no faults are present.

Baseline data 416 also may include data that is artificially generated or simulated. A comparison of the responses with baseline data 416 may be used to identify fault data 418. Fault data 418 may include, for example, pre-existing faults, new faults, and/or other fault information. This information also may be acknowledged or verified by maintenance personnel, a crew member, or some other suitable entity. In the different advantageous embodiments, fault data 418 may be complimented and/or updated with information and/or actions taken in response to a presentation of fault information in fault display 419.

In these illustrative examples, the test signals sent into wiring system 404 are spread spectrum signals that contain pseudo noise binary code. Through the use of spread spectrum signals, test signals may be sent into wiring system 404 during operation of wiring system 404 without interfering with or minimizing the normal operation of wiring system 404. Further, the responses obtained by sensors 410 using this type of signal may be able to detect and identify faults even with the presence of electrical signals during operation of wiring system 404.

In these examples, monitoring process 412 may monitor wiring system 404 during operation of wiring system 404. Wiring system 404 is considered to be in operation during normal use. For example, wiring system 404 is in operation when power and/or data signals are being sent across paths 408 between devices 406.

Monitoring process 412 may send test signals into wiring system 404 using different sampling rates. These sampling rates may vary depending on the particular implementation. For example, the sampling rate of 100 times per second, 1000 times per second, 4000 times per second, or some other suitable sampling rate may be used.

Fault presentation 414 may obtain fault data 418 and generate fault display 419 using schematic diagram data 420 and vehicle installation data 422. Fault data 418 also may include additional information and potential actions that may be taken in response to faults that may be identified for particular components. Fault display 419 is a display that may be generated by monitoring unit 402. This display may be presented on a display device. Fault display 419 may include wiring diagram 424, as well as controls or other user interface components.

In the different advantageous embodiments, wiring diagram 424 may illuminate any faults that have been detected. As used herein, illuminate means to visually present an identification of the fault. This visual indication may include highlighting or otherwise emphasizing a path on which the fault may be located. This illuminating also may include, for example, indicating on the path an approximate location of where the fault may be found. Wiring diagram 424 may be forwarded to various users or operators such as, for example, a maintenance crew.

Wiring diagram 424 may include various types of diagrams. These diagrams may include, for example, a schematic diagram. A schematic diagram identifies devices and paths between devices for wiring system 404. Fault display 419 may also include installation diagram 426. Installation diagram 426 may include a schematic diagram that is combined with a diagram of the vehicle in which the various devices and paths are presented in a manner showing their actual locations within the vehicle. These types of diagrams may provide a user an identification of a location of a fault within wiring system 404.

Schematic diagram data 420 may take various forms. For example, schematic diagram data 420 may be a two dimensional or three dimensional drawing of devices in paths. In other advantageous embodiments, schematic diagram data 420 may merely contain data identifying the paths and devices. Vehicle installation data 422 may take the form of drawings or data identifying the locations of paths and devices within the vehicle for wiring system 404. This information may be used to generate schematic diagrams and/or installation diagrams for presentation as wiring diagram 424 in fault display 419.

Fault presentation 414 may present a schematic diagram in wiring diagram 424 from schematic diagram data 420 of the portion of wiring system 404 containing a path in which a fault has been found. Additionally, fault presentation 414 also presents an indication of the fault. This indication identifies the path in which the fault occurred, as well as an estimate of the location of the fault along the path. The indication or identification of the path may be made in a number of different ways.

For example, text may be used to identify a particular identifier for a path. A graphical indicator may be associated with the path in fault display 419. This graphical indicator may be, for example, presenting the path in a particular color, displaying a graphical indicator in association with a path, or some other suitable graphical indicator.

Further, the identification of the location of the fault may be made in a number of different ways. For example, text may be present to identify a distance from one end of the path to the fault. In other advantageous embodiments, a graphical indicator may be displayed on the path in a location of the fault.

As a further feature, fault display 419 also may display the schematic diagram as an overlay or in conjunction with a portion of the vehicle in which the wiring system has been installed as an installation diagram. In other words, fault display 419 may include an identification of the location in the vehicle at which different devices and paths are actually located in the vehicle. In this manner, a user may be able to identify access points or locations to access a fault that has been identified.

For example, a user may be able to identify an access port within a vehicle at which the fault may be accessed. In another illustrative example, fault display 419 may identify if the path is located in the crown, the fuselage, the floor, or some other part of an aircraft. Further, in some advantageous embodiments, fault display 419 also may identify the best access point to reach the location of a fault.

The illustration of monitoring environment 400 in FIG. 4 is presented for purposes of illustrating different features of the advantageous embodiments and not meant to imply physical or architectural limitations to the manner in which different features may be implemented. For example, in other advantageous embodiments, fault presentation 414 and fault data 418 may be located remote to the vehicle. In other advantageous embodiments, multiple monitoring units may be present for different portions of the wiring system.

Figure 5:
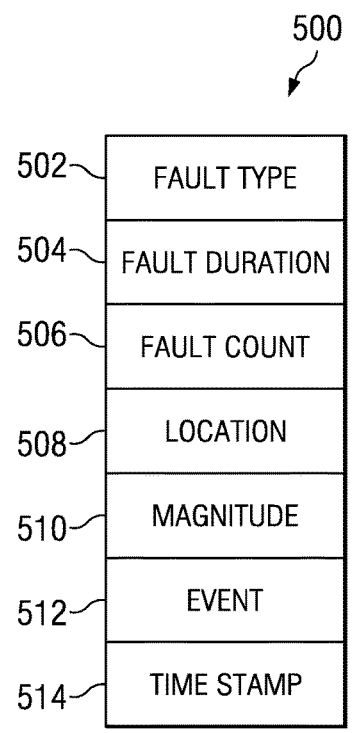
FIG. 5 is a diagram illustrating an example of fault data in accordance with an advantageous embodiment.

With reference now to FIG. 5, a diagram illustrating an example of fault data is depicted in accordance with an advantageous embodiment. Fault data 500 is an example of fault data that may be found in fault data 418 in FIG. 4. Fault data 500 includes fault type 502, fault duration 504, fault count 506, location 508, magnitude 510, event 512, and time stamp 514.

Fault type 502 may be, for example, open circuit, high impedance fault, short circuit, low impedance fault, or some other suitable type of fault. Fault duration 504 may identify the length of time during which a fault has occurred. This information may be useful when a fault is intermittent. Fault count 506 may identify a number of times that a fault has occurred. This type of information also may be useful when the fault is an intermittent fault.

Location 508 is the location or estimate of the location at which the fault was detected. Location 508 may include a distance from one end of a path. Further, location 508 also may include an identification of a system or sub-system in which the path is located.

Magnitude 510 may be used to indicate the relative significance of a fault condition. For example, red may indicate a hazard or high percentage, yellow may indicate caution or a medium percentage, green may indicate normal or a low percentage. Also, magnitude 510 may be used to indicate a recommended priority for an action such as, for example, a maintenance action needed to resolve and/or repair the fault condition. Magnitude 510 may take different formats. For example, magnitude 510 may be a percentage, a range of numbers, and/or a set of colors. Event 512 may be a system or subsystem effect associated with or due to a fault. Time stamp 514 identifies a time of when fault data 500 was received or generated.

The illustration of fault data 500 is presented for purposes of illustrating examples of information that may be found in fault data 418 in FIG. 4. Of course, other types of information may be used in addition to or in place of the different fields illustrated for fault data 500. For example, fault data 500 also may include an identification of devices, wire types, or other suitable information.

Figure 6:
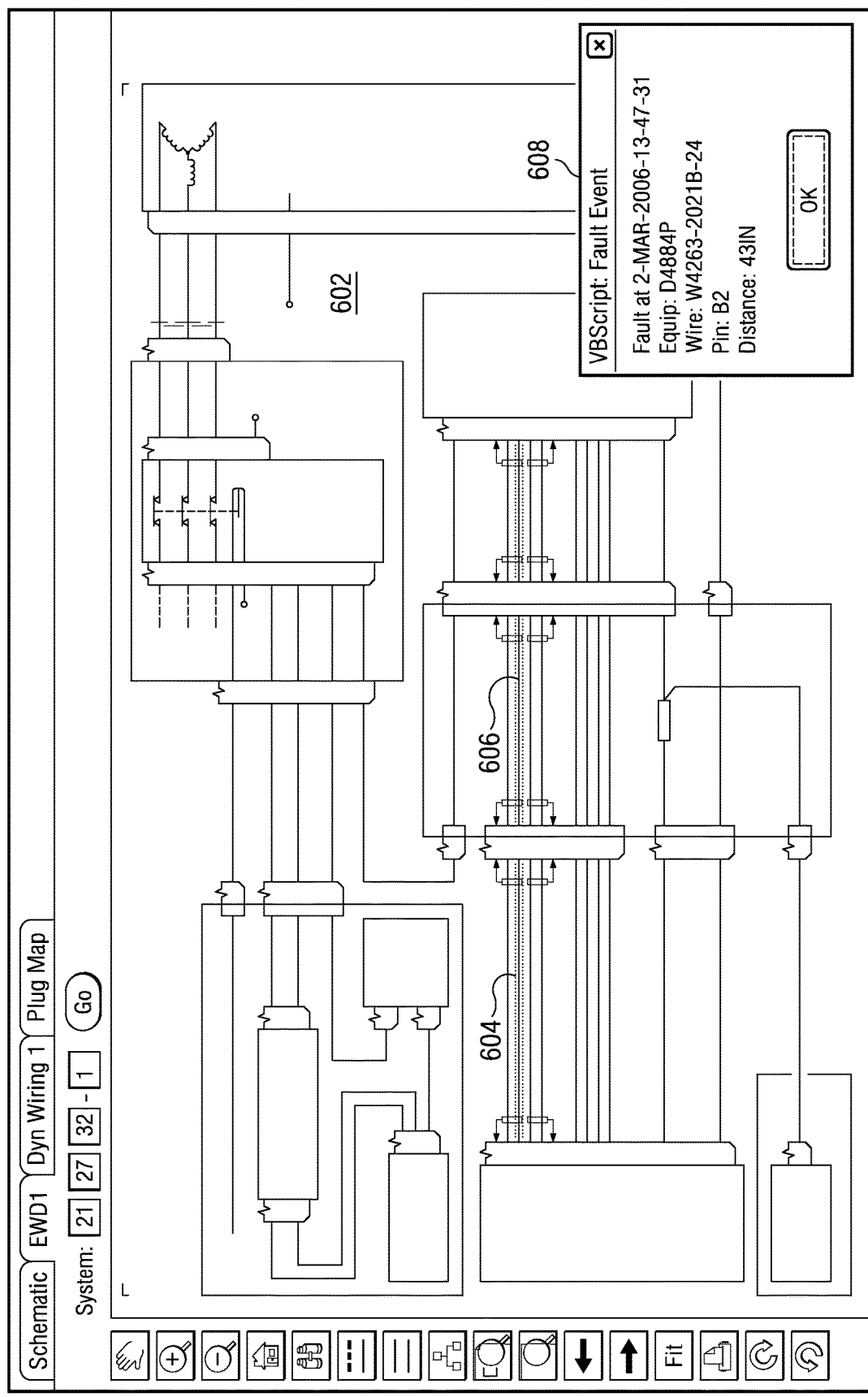
FIG. 6 is a diagram of an example of a fault display in accordance with an advantageous embodiment.

With reference now to FIG. 6, a diagram of an example of a fault display is depicted in accordance with an advantageous embodiment. Display 600 is an example of fault display 419 in FIG. 4.

Display 600 displays fault data on an existing schematic diagram. In this example, schematic diagram 602 is an existing schematic diagram that may be obtained from schematic diagram data 420 in FIG. 4.

In this illustrative example, path 604 is a wire in which a fault is present. Indicator 606 and window 608 present fault data with respect to path 604. Indicator 606 identifies path 604 in the wiring system as containing a fault.

Window 608 identifies a time at which the fault was identified, equipment in which the fault is located, a wire in which the fault is present, a pin identifier, and a distance. The pin identifier may identify a pin in the device that may be associated with the fault. Window 608 provides a textual description of the fault, while indicator 606 highlights the path and components that may be associated with the fault.

Figure 7:
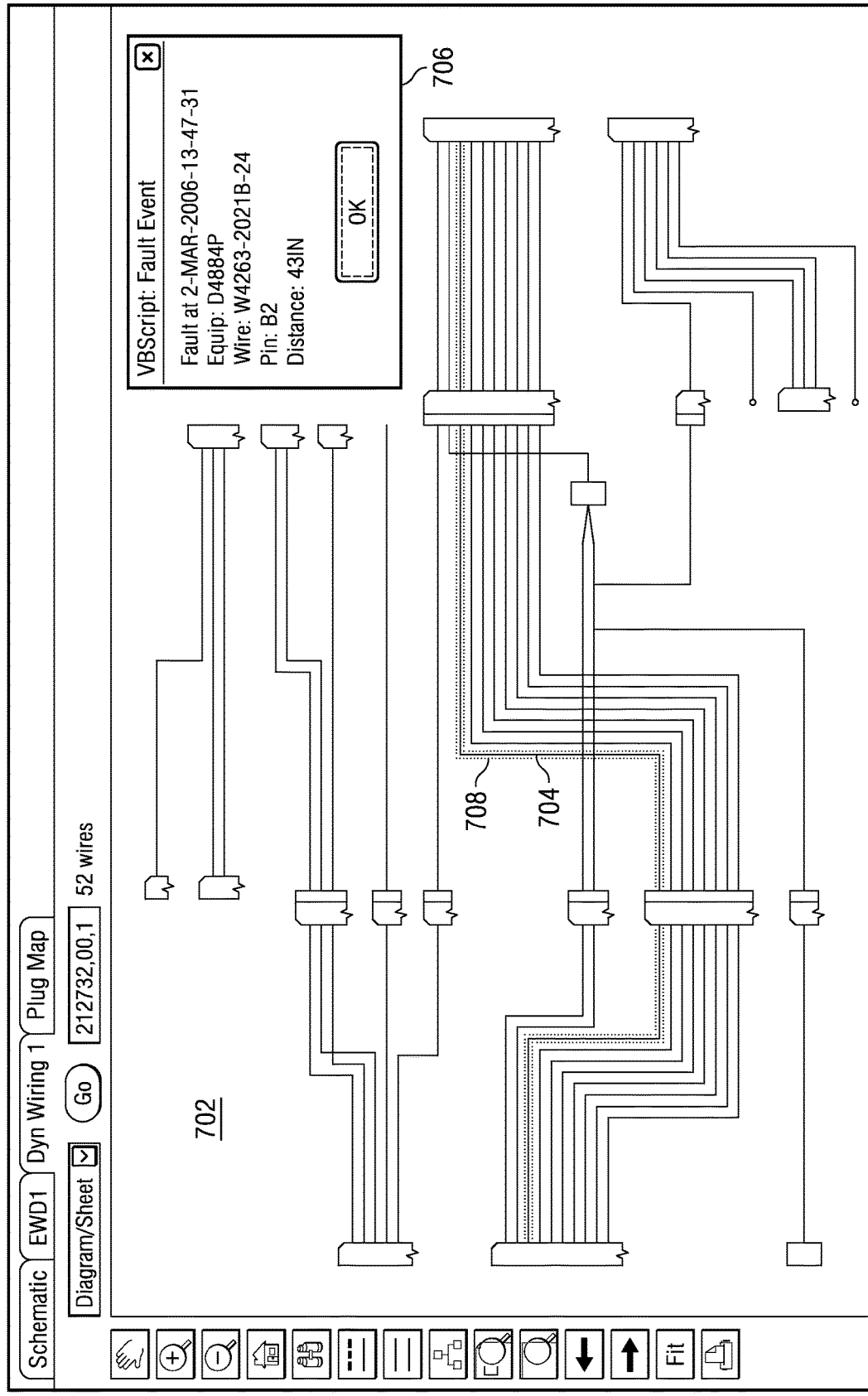
FIG. 7 is another example of a fault display in accordance with an advantageous embodiment.

With reference now to FIG. 7, another example of a fault display is depicted in accordance with an advantageous embodiment. In this example, display 700 is an example of fault display 419 in FIG. 4. Schematic diagram 702 within display 700 is generated directly from data regarding a wiring system rather than using a pre-existing diagram. In this example, path 704 is a path in which a fault has been identified within a wiring system. In this example, an entire system schematic is generated in display 700, showing a textual description of the fault in window 706 and an identification of the fault within the diagram using graphical indicator 708.

Figure 8:
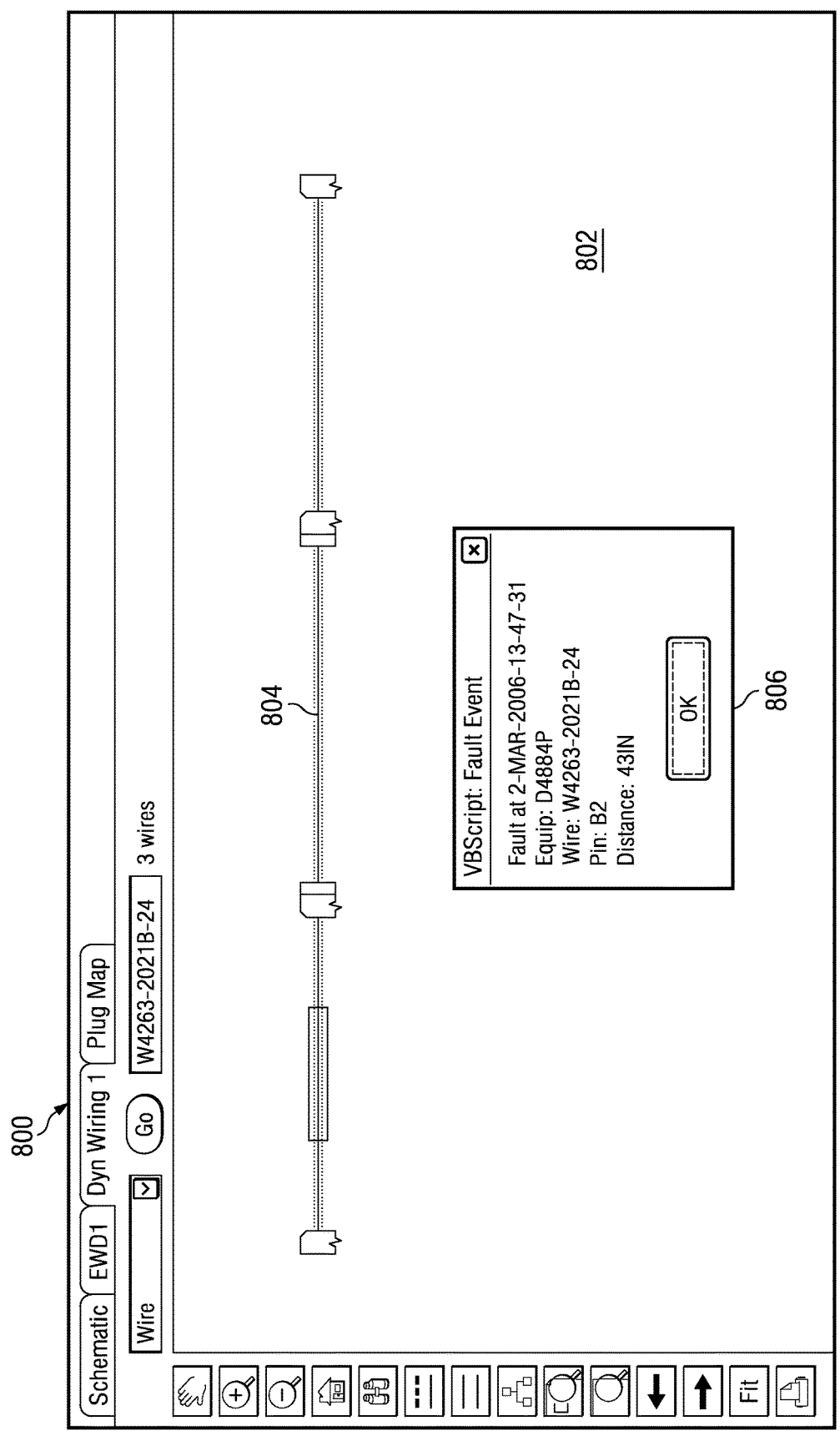
FIG. 8 is a diagram illustrating a fault display in accordance with an advantageous embodiment.

With reference now to FIG. 8, a diagram illustrating a fault display is depicted in accordance with an advantageous embodiment. Display 800 is an example of fault display 419 in FIG. 4. In this example, display 800 displays schematic diagram 802 with only a display of the wire and a signal path for path 804. Window 806 provides the textual description of the fault. In this manner, display 800 may focus a maintenance person's attention to the faulty components.

Figure 9:
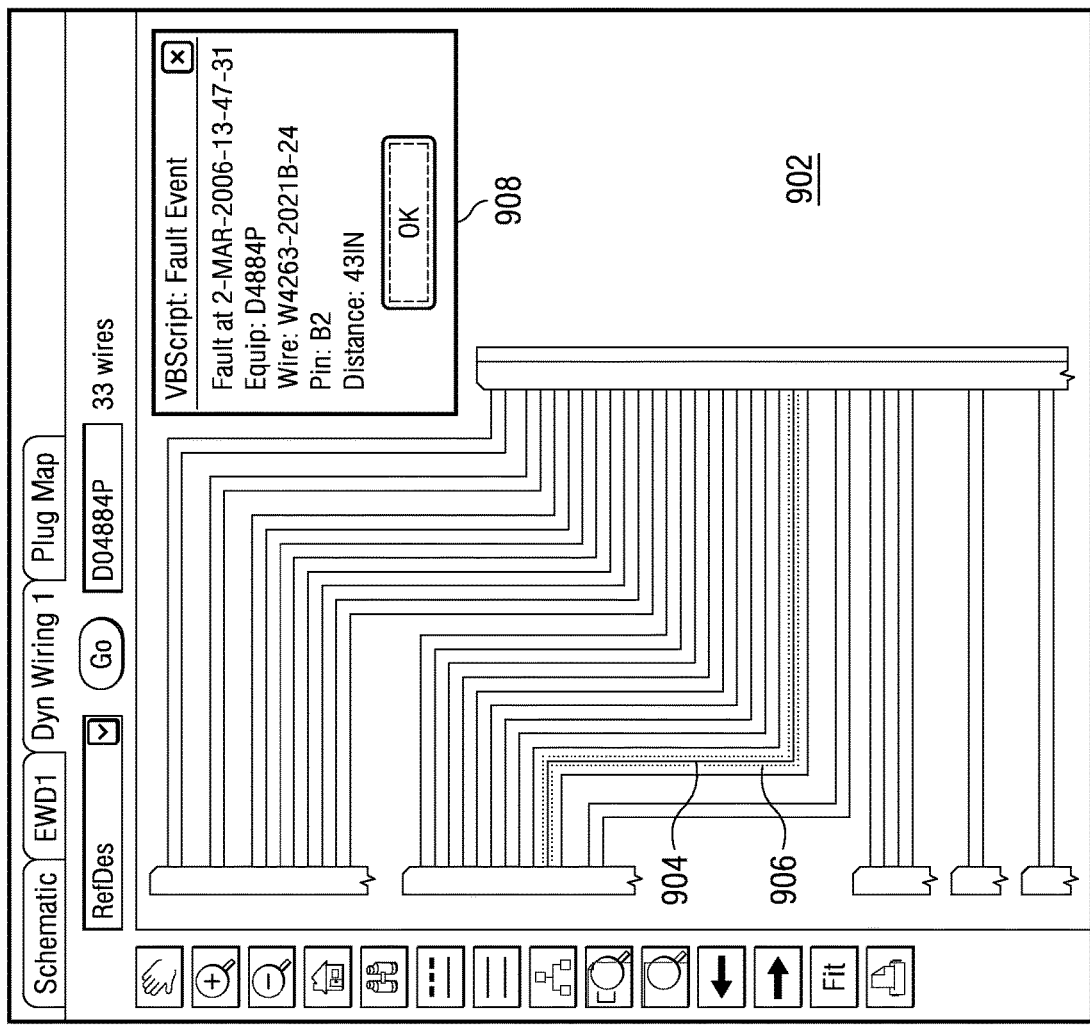
FIG. 9 is a diagram illustrating an example of a fault in accordance with an advantageous embodiment.

With reference now to FIG. 9, a diagram illustrating an example of a fault is depicted in accordance with an advantageous embodiment. Display 900 is another example of fault display 419 in FIG. 4. In this example, display 900 presents schematic diagram 902, which contains all of the wires on the associated connector including the faulty wire. As can be seen, path 904 containing the faulty wire is identified using indicator 906. A textual description of the fault is identified in window 908. In this manner, display 900 may focus a maintenance person's attention to the particular plug, jack, and/or other connector containing the path having the faults.

Figure 10:
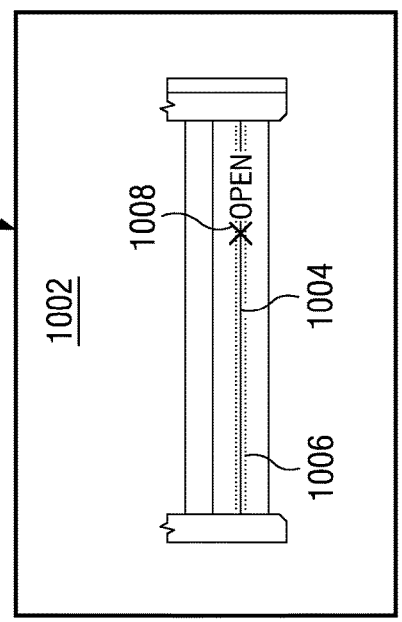
FIG. 10 is a diagram illustrating a fault display in accordance with an advantageous embodiment.

With reference now to FIG. 10, a diagram illustrating a fault display is depicted in accordance with an advantageous embodiment. In this example, display 1000 is another example of an implementation for fault display 419 in FIG. 4. In this example, display 1000 presents schematic diagram 1002, which is a proportional diagram of the isolated path. In this example, path 1004 is identified using indicator 1006. Further, an identification of the location of the fault is made using graphical indicator 1008, which is an X. Further, graphical indicator 1008 also indicates that the fault is an open fault. In this example, an additional pop-up window is not presented in display 1000. The presentation of additional information may not be present depending on a particular implementation.

Figure 11:
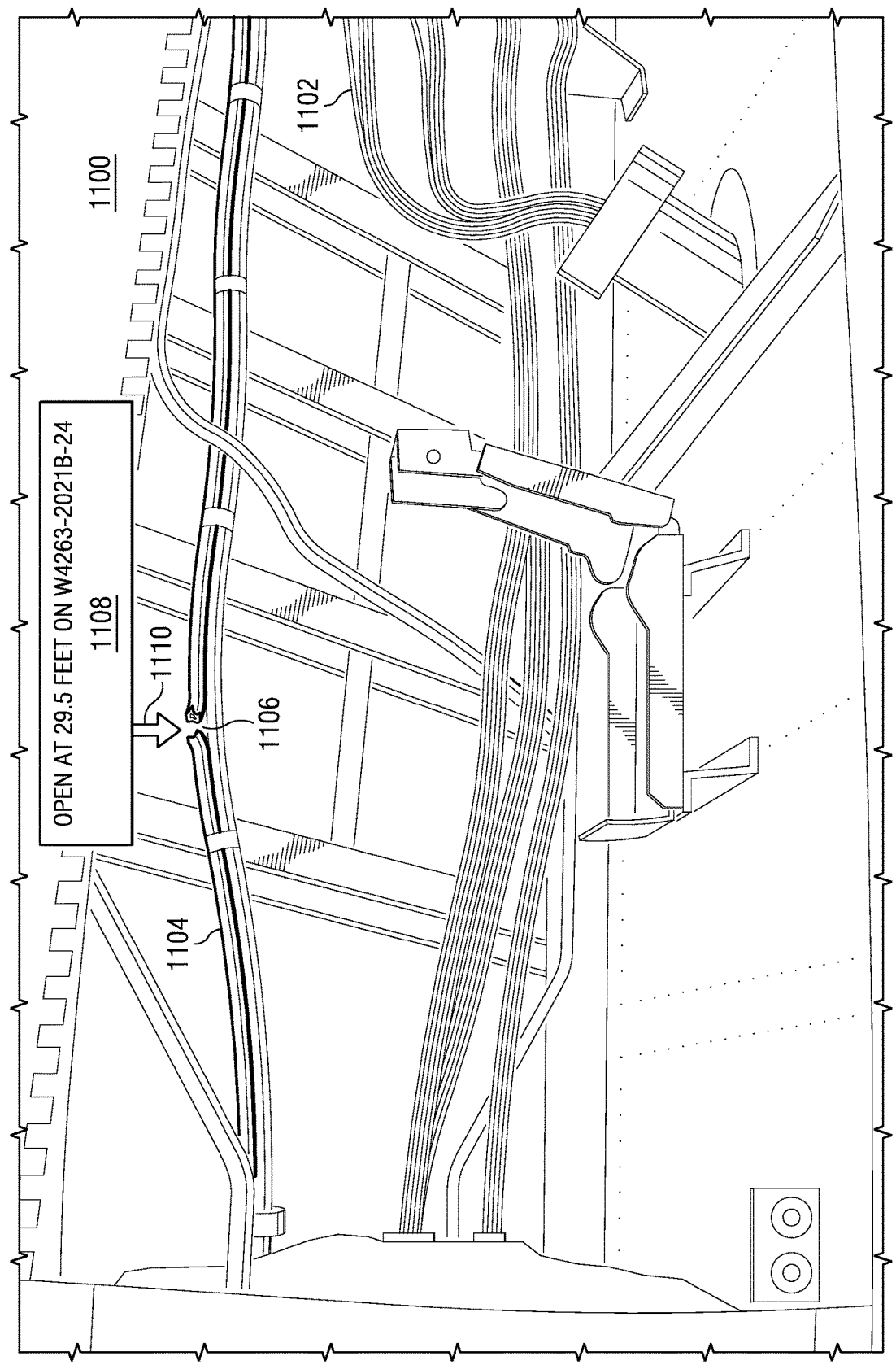
FIG. 11 is a diagram illustrating a fault display in accordance with an advantageous embodiment.

With reference now to FIG. 11, a diagram illustrating a fault display is depicted in accordance with an advantageous embodiment. In this example, display 1100 is an example of fault display 419 in FIG. 4.

Installation diagram 1102 illustrates a portion of a wing area in an aircraft. As can be seen in this example, installation diagram 1102 shows various harnesses and wires. In this example, cable 1104 has been illuminated to indicate a fault at a location identified by indicator 1106. Indicator 1106 may be any graphical indicator that may provide a visual identification of a location of a fault. In this illustrative example, indicator 1106 is presented as a break in cable 1104. In other advantageous embodiments, indicator 1106 may be presented using other graphical indicators to visually identify a location of the fault. For example, highlighting, an icon, a graphical symbol, animation, or some other suitable indicator may be used.

Further, display 1100 also presents access information in section 1108. Also, in some advantageous embodiments, a graphical indicator such as arrow 1110, associated with section 1108, may be used to help identify or draw attention to the location of the fault identified by indicator 1106.

Figure 12:
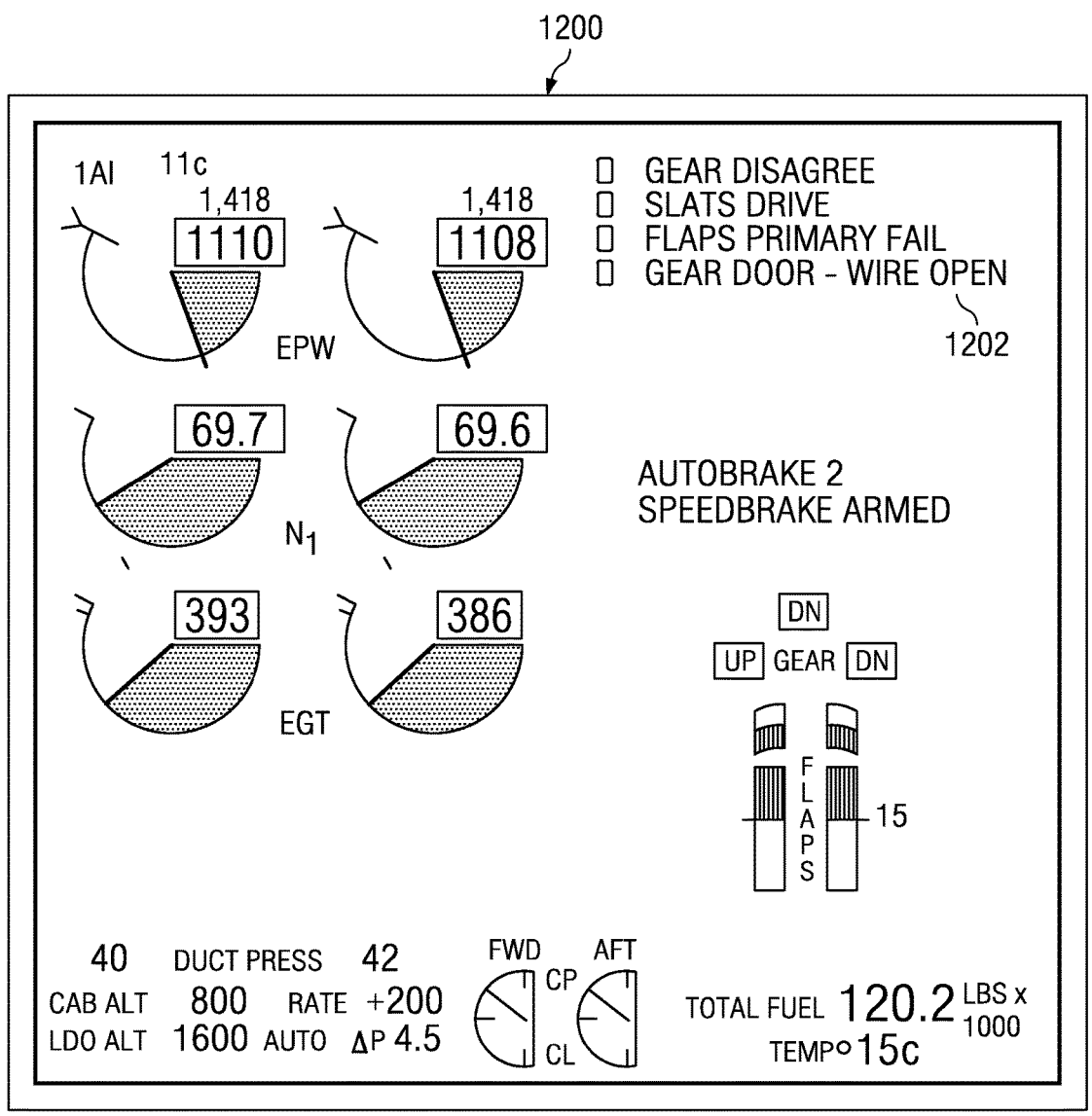
FIG. 12 is a diagram illustrating reporting of a wire fault through a maintenance panel in accordance with an advantageous embodiment.

With reference now to FIG. 12, a diagram illustrating reporting of a wire fault through a maintenance panel is depicted in accordance with an advantageous embodiment. Maintenance panel display 1200 is an example of a presentation presented by a maintenance panel and/or central maintenance computer for use in reporting faults. Maintenance panel display 1200 may be presented in fault display 419 by monitoring unit 402. Alternatively, maintenance panel display 1200 may be presented in another system within aircraft 200 or even remotely at a ground facility.

In this example, maintenance panel display 1200 takes the form of an Engine Indicating and Crew Alerting System (EICAS) that may be presented by monitoring environment 400 in fault display 419. In other embodiments, maintenance panel display 1200 may be a central maintenance computer display. These maintenance panel displays are used to display alerts and/or other suitable status information for an aircraft.

In this illustrative example, advisory message 1202 indicates that a wire is open for the gear door. This information in advisory message 1202 may be generated by monitoring unit 402 when a fault is detected within wiring system 400 for the gear door. Monitoring unit 402 may present the information on fault display 419. In addition, monitoring unit 402 may send the information to other systems for presentation and/or analysis.

The illustration of the different types of fault displays in FIGS. 6-12 have been presented for purposes of illustrating examples of how fault information may be presented. These illustrations are not meant to limit the manner in which fault information may be displayed. For example, in other advantageous embodiments, textual information may be presented directly within the schematic diagram rather than within windows. In yet other advantageous embodiments, textual information may not be needed.

Figure 13:
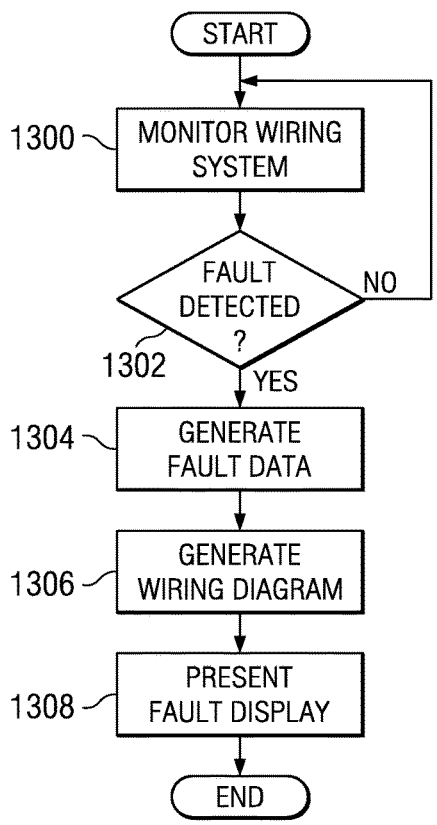
FIG. 13 is a flowchart of a process for identifying faults in a wiring system in accordance with an advantageous embodiment.

With reference now to FIG. 13, a flowchart of a process for identifying faults in a wiring system is depicted in accordance with an advantageous embodiment. The process illustrated in FIG. 13 may be implemented in a monitoring unit, such as monitoring unit 402 in FIG. 4.

The process begins by monitoring a wiring system for a fault during operation of the wiring system (operation 1300). This operation is performed during actual use of the wiring system in which data and/or power may be conducted through different conductor paths.

A determination is made as to whether a fault has been detected (operation 1302). If a fault has not been detected, the process returns to operation 1300.

If a fault is detected, the fault data is generated (operation 1304). This fault data may include, for example, a time at which the fault was found, an estimate of the location of the fault, a type of fault, a magnitude of the fault, and/or components associated with the fault.

The process then generates a wiring diagram (operation 1306). The wiring diagram may be a schematic diagram containing the path as well as fault information. The fault information includes an identification of the location of the fault along the path, in these examples. Further, the wiring diagram generated in operation 1306 also may include a location of a portion of the vehicle in which the path is located. In this type of display, the schematic diagram is generated in a manner so that it overlays a drawing of the vehicle to provide an installation diagram.

The process presents a fault display (operation 1308), with the process terminating thereafter. In operation 1308, the wiring diagram is displayed in association with the fault data.

Figure 14:
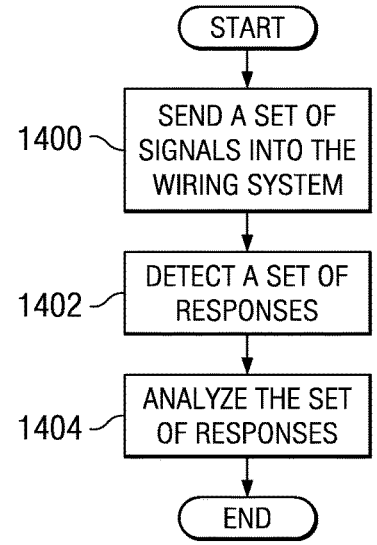
FIG. 14 is a flowchart of a process for monitoring a wiring system in accordance with an advantageous embodiment.

With reference now to FIG. 14, a flowchart of a process for monitoring a wiring system is depicted in accordance with an advantageous embodiment. FIG. 14 is an example of one manner in which operation 1300 in FIG. 13 may be implemented.

The process begins by sending a set of test signals into the wiring system (operation 1400). A set, as used herein, refers to one or more items. For example, a set of test signals is one or more test signals. The process then detects a set of responses (operation 1402). These responses may be echoes or reflected pulses generated in response to the set of test signals. The set of test signals is a set of spread spectrum time domain signals that contain pseudo noise codes in these examples. Next, the process analyzes the set of responses (operation 1404), with the process terminating thereafter.

Figure 15:
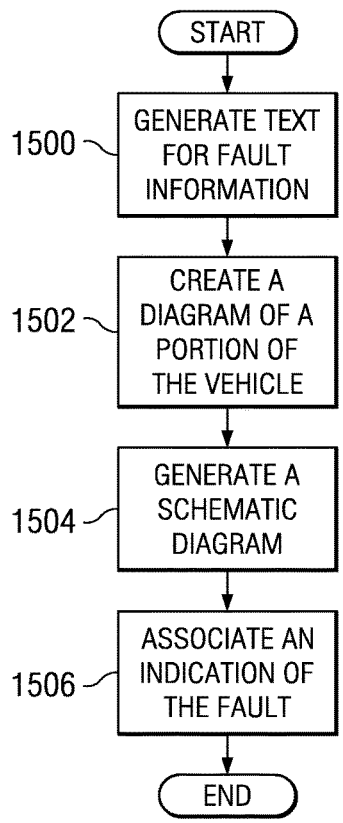
FIG. 15 is a flowchart of a process for generating a wiring diagram in accordance with an advantageous embodiment.

With reference now to FIG. 15, a flowchart of a process for generating a wiring diagram is depicted in accordance with an advantageous embodiment. In this example, the process in FIG. 15 is a more detailed example of one implementation for operation 1306 in FIG. 13.

The process begins by generating text for fault information (operation 1500). This text may be similar to the text found in window 606 in FIG. 6. The process creates a diagram of the portion of the vehicle containing the path in which the fault is located (operation 1502). This diagram also may be referred to as an installation diagram.

The process creates a schematic diagram (operation 1504). This schematic diagram contains the path in which the fault was detected. This schematic diagram is associated with the diagram of the portion of the vehicle. The process then associates an indication of the fault in the location of the path that correlates to a location of the fault in the wiring diagram (operation 1506). This location may be proportionate with respect to the distance on the path of the location of the fault on the path. The process terminates thereafter. The diagram of the portion of the vehicle and the schematic diagram together form a wiring diagram in these examples.

These different operations in FIG. 15 are presented for purposes of illustrating one manner in which a wiring diagram may be created for display in a fault display. In other advantageous embodiments, other operations may be used in place of or in addition to the ones illustrated here. Further, some operations may be omitted depending on the particular type of display. For example, in one advantageous embodiment, operation 1500 may be omitted.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

Thus, the different advantageous embodiments provide a computer implemented method, apparatus, and computer usable program code for identifying faults in a wiring system. The different advantageous embodiments may monitor the wiring system for a fault during the operation of the wiring system.

In response to detecting the fault, a location of the fault may be estimated within the wiring system. The wiring diagram for the wiring system is presented with an indication of the location of the fault within the wiring system. In this manner, intermittent faults may be identified and located through the monitoring of the wiring system during operation of the wiring system. The different advantageous embodiments provide a capability to identify and present a location of the fault to facilitate performing maintenance operations to resolve and/or fix the fault.

The different advantageous embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non-limiting examples of a computer readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W) and DVD.

Further, a computer usable or computer readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example, without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters are just a few of the currently available types of communications adapters.

The description of the different advantageous embodiments has been presented for purposes of illustration and description, and is not intended to be exhaustive or limited to the embodiments in the form disclosed. Many modifications and variations will be apparent to those of ordinary skill in the art. Although the different advantageous embodiments have been described with respect to an aircraft, other advantageous embodiments may be applied to other types of objects.

For example, without limitation, other advantageous embodiments may be applied to a mobile platform, a stationary platform, a land-based structure, an aquatic-based structure, a space-based structure and/or some other suitable object. More specifically, the different advantageous embodiments may be applied to, for example, without limitation, a submarine, a bus, a personnel carrier, a tank, a train, an automobile, a spacecraft, a surface ship, a power plant, a manufacturing facility, and/or a building.

Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A computer implemented method for illuminating faults in a wiring system in a vehicle, the computer implemented method comprising:

sending a set of spread spectrum test time domain reflectometry signals through a set of paths in the wiring system in the vehicle during operation of the wiring system, wherein the set of spread spectrum test signals includes a pseudo noise code, operation of the wiring system comprises normal usage of the wiring system in operation in which data signals, power, or data signals and power are present in the wiring system;

detecting a set of reflected pulses generated in response to the set of test signals during operation of the wiring system;

analyzing in real time the set of reflected pulses to determine whether the fault has occurred;

responsive to detecting the fault, estimating a location of the fault within the wiring system;

presenting a wiring diagram for the wiring system with an indication of the location of the fault within the wiring system; and presenting an installation diagram for the wiring system with an indication of the location of the fault within the installation diagram, the installation diagram comprising the wiring diagram combined with a diagram of the vehicle so as to identify an actual location of the fault within the vehicle, and the installation diagram illustrating a physical relationship between the wiring diagram and the diagram of the vehicle.

2. The computer implemented method of claim 1, wherein the presenting step comprises:

generating a wiring diagram of a path in the vehicle in which the fault was detected; and associating an indication of the fault in the actual location of the fault in the path that correlates to the actual location of the fault.

3. The computer implemented method of claim 1, wherein the presenting step further comprises:

creating a wiring diagram of a portion of the vehicle containing a path in which the fault is located;

generating the wiring diagram containing the path in which the fault was detected in association with the diagram;

associating the indication of the fault in the location of the path that correlates to the location of the fault to form the wiring diagram; and presenting the wiring diagram for the wiring system with an indication of the location of the fault within the wiring system wherein the location identifies a distance from one end of a path to the fault and indicates the actual location of the fault relative to devices positioned in the vehicle.

4. The computer implemented method of claim 3 further comprising:

presenting fault information comprising at least one of a wire identification, a magnitude of the fault, and a type of fault detected, and wherein type of fault comprises at least one from the group consisting of open circuit, short circuit, high impedance fault, and low impedance fault.

5. The computer implemented method of claim 3 further comprising:

indicating a best access point in the vehicle to reach the actual location of the fault.

6. The method of claim 1 wherein the wiring diagram comprises a three dimensional diagram.

7. The computer implemented method of claim 1 wherein the step of presenting an installation diagram comprises presenting the installation diagram on a computer at a maintenance facility for the vehicle.

8. The computer implemented method of claim 1 wherein the step of analyzing the set of reflected pulses to determine whether the fault has occurred includes analyzing for both intermittent and hard faults in real time.

9. The computer implemented method of claim 8 wherein intermittent faults comprise faults present when the wiring system is in operation but not at rest.

10. The computer implemented method of claim 1 further comprising generating baseline data for the wiring system.

11. The computer implemented method of claim 1 wherein the step of presenting an installation diagram further comprises identifying an access port on the vehicle for repair of the fault.

12. The computer implemented method of claim 1, wherein in operation the wiring system carries only data signals.

13. A data processing system in a vehicle comprising:

a bus;

a communications unit connected to the bus;

a storage device connected to the bus, wherein the storage device includes program code; and a processor unit connected to the bus, wherein the processor unit executes the program to send a set of spread spectrum time domain reflectometry test signals through a set of paths in a wiring system in the vehicle during operation of the wiring system, operation of the wiring system comprises normal usage of the wiring system in operation in which data signals, power, or data signals and power are present in the wiring system, wherein the set of spread spectrum test signals includes a pseudo noise code; detect a set of reflected pulses generated in response to the set of test signals during operation of the wiring system; and analyze in real time the set of reflected pulses to determine whether a fault has occurred during operation of the wiring system; estimate a location of the fault within the wiring system in response to detecting the fault; present a wiring diagram for the wiring system with an indication of the location of the fault within the wiring system; and present an installation diagram for the wiring system with an indication of the location of the fault within the installation diagram, the installation diagram comprising the wiring diagram combined with a diagram of a vehicle so as to identify an actual location of the fault within the vehicle, and the installation diagram illustrating a physical relationship between the wiring diagram and the diagram of the vehicle.

14. The data processing system of claim 13, wherein in executing the program code to present the wiring diagram for the wiring system with the indication of the location of the fault within the wiring system, the processor unit executes the program code to generate a wiring diagram of a path in which the actual location of the fault was detected; and associate an indication of the fault in the actual location of the fault in the path that correlates to the actual location of the fault.

15. The data processing system of claim 13, wherein in executing the program code to present the wiring diagram for the wiring system with the indication of the location of the fault within the wiring system, the processor unit executes the program code to create a diagram of a portion of the vehicle containing a path in which the fault is located; generate the wiring diagram containing the path in which the fault was detected in association with the diagram; associate the indication of the fault in the location of the path that correlates to the location of the fault to form the wiring diagram; and present the wiring diagram for the wiring system with an indication of the location of the fault within the wiring system wherein the location identifies a distance from one end of a path to the fault and indicates the actual location of the fault relative to devices positioned in the vehicle.

16. The data processing system of claim 15, wherein the processor unit further executes the program code to present fault information comprising at least one of a wire identification, a magnitude of the fault, and a type of fault detected, and wherein type of fault comprises at least one from the group consisting of open circuit, short circuit, high impedance fault, and low impedance fault.

17. A computer program product comprising:
a non-transitory computer usable medium having computer usable program code for identifying faults in a wiring system in a vehicle, the computer program product comprising:
a computer recordable storage medium;
program code, stored on the computer recordable storage medium, for sending a set of spread spectrum time domain reflectometry test signals through a set of paths in the wiring system during operation of the wiring system, operation of the wiring system comprises normal usage of the wiring system in operation in which data signals, power, or data signals and power are present in the wiring system;
program code, stored on the computer recordable storage medium, for detecting a set of reflected pulses generated in response to the set of test signals, wherein the set of spread spectrum test signals includes a pseudo noise code, during operation of the wiring system;
program code, stored on the computer recordable storage medium, for analyzing in real time the set of reflected pulses to determine whether the fault has occurred;
program code, stored on the computer recordable storage medium, responsive to detecting the fault, for estimating a location of the fault within the wiring system;
program code, stored on the computer recordable storage medium, for presenting a wiring diagram for the wiring system with an indication of the location of the fault within the wiring system; and
program code, stored on the computer recordable storage medium, presenting an installation diagram for the wiring system with an indication of the location of the fault within the installation diagram, the installation diagram comprising the wiring diagram combined with a diagram of the vehicle so as to identify an actual location of the fault within the vehicle, and the installation diagram illustrating a physical relationship between the wiring diagram and the diagram of the vehicle.

18. The computer program product of claim 17, wherein program code, stored on the computer recordable storage medium, for presenting the wiring diagram for the wiring system with the indication of the location of the fault within the wiring system comprises:

program code, stored on the computer recordable storage medium, for generating the wiring diagram containing a path in which the fault was detected; and
program code, stored on the computer recordable storage medium, for associating an indication of the fault in a location in the path that correlates to the location of the fault.

19. A computer implemented method for illuminating faults in a wiring system in a vehicle, the computer implemented method comprising:
sending a set of spread spectrum time domain reflectometry test signals through a set of paths in the wiring system in the vehicle during operation of the wiring system, operation of the wiring system comprises normal usage of the wiring system in operation in which data signals, power, or data signals and power are present in the wiring system;
detecting a set of reflected pulses generated in response to the set of test signals; and
analyzing in real time the set of reflected pulses to determine whether the fault has occurred;
responsive to detecting the fault, estimating a location of the fault within the wiring system;
presenting a wiring diagram for the wiring system with an indication of the location of the fault within the wiring system, wherein the location identifies a distance from one end of a path to the fault;
presenting a three dimensional installation diagram for the wiring system at a maintenance facility for the vehicle with an indication of the location of the fault within the installation diagram, the installation diagram comprising the wiring diagram combined with a diagram of the vehicle so as to identify an actual location of the fault within the vehicle, and the installation diagram illustrating a physical relationship between the wiring diagram and the diagram of the vehicle; and
presenting fault data relating to the fault.

20. The method of claim 19 wherein the fault data comprises at least one of fault duration, fault count, and fault magnitude.

21. The method of claim 19 wherein the steps of monitoring the wiring system, estimating a location, presenting a wiring diagram, and presenting fault data, occur with the presence of electrical signals during operation of the wiring system.

22. The method of claim 19 further comprising sending testing signals into the wiring system using different sampling rates.

23. The method of claim 19 further comprising presenting a text description of the fault.

24. The method of claim 19 further comprising presenting a graphical indicator of the fault location.

25. The method of claim 19 further comprising indicating in what part of the vehicle the actual location of the fault is positioned.

26. The method of claim 19 further comprising indicating in what system of the vehicle the actual location of the fault is positioned.

27. The method of claim 19 further comprising illuminating a wire in which the fault is actually located relative to structures of the vehicle to provide a visual indication of the actual location of the fault.

* * * * *

UNITED STATES PATENT AND TRADEMARK OFFICE
CERTIFICATE OF CORRECTION

PATENT NO. : 9,658,271 B2
APPLICATION NO. : 12/208638
DATED : May 23, 2017
INVENTOR(S) : Thomas et al.

It is certified that error appears in the above-identified patent and that said Letters Patent is hereby corrected as shown below:

Column 16, Line 6, change "an installation" to -- the installation --
        Line 19, change "an installation" to -- the installation --
        Line 33, change "the vehicle" to -- a vehicle --
        Line 62, change "an indication" to -- the indication --

Column 17, Line 9, change "an indication" to -- the indication --
        Line 18, change "wherein type" to -- wherein the type --
        Line 42, change "the fault" to -- a fault --

Column 18, Line 43, change "a location, presenting a" to -- the location, presenting the --
        Line 44, change "presenting fault" to -- presenting the fault --

Signed and Sealed this
Thirteenth Day of February, 2018

Andrei Iancu
*Director of the United States Patent and Trademark Office*